(12) United States Patent
Tsukamoto

(10) Patent No.: US 7,963,637 B2
(45) Date of Patent: Jun. 21, 2011

(54) METHOD OF DRIVING PIEZOELECTRIC ACTUATOR AND LIQUID EJECTION APPARATUS

(75) Inventor: Ryuji Tsukamoto, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 258 days.

(21) Appl. No.: 12/265,576

(22) Filed: Nov. 5, 2008

(65) Prior Publication Data
US 2009/0115821 A1    May 7, 2009

(30) Foreign Application Priority Data

Nov. 6, 2007   (JP) .................................. 2007-288301

(51) Int. Cl.
*B41J 2/045* (2006.01)
*H01L 41/00* (2006.01)
(52) U.S. Cl. ................. 347/68; 347/70; 347/71; 347/72; 310/324; 310/340
(58) Field of Classification Search ................ 347/68, 347/70–72; 310/324, 340
See application file for complete search history.

(56) References Cited

U.S. PATENT DOCUMENTS

| 6,454,395 | B1 * | 9/2002 | Irinoda ........................... 347/54 |
| 2005/0046310 | A1 * | 3/2005 | Kobayashi et al. ........... 310/328 |
| 2005/0258719 | A1 * | 11/2005 | Sugahara et al. ............ 310/365 |
| 2008/0024042 | A1 * | 1/2008 | Isobe et al. .................... 310/365 |

FOREIGN PATENT DOCUMENTS

| JP | 2003-188429 A | 7/2003 |
| JP | 2003-260793 A | 9/2003 |

* cited by examiner

*Primary Examiner* — Charlie Peng
*Assistant Examiner* — Hung Lam
(74) *Attorney, Agent, or Firm* — Birch, Stewart, Kolasch & Birch, LLP

(57) ABSTRACT

A method of driving a piezoelectric actuator which is constituted of a lower electrode film, a piezoelectric film and an upper electrode film that are layered successively onto a diaphragm, includes the step of: applying an electric field to the piezoelectric film in a direction opposite to the orientation direction of the piezoelectric film while continuously changing an intensity of the electric field from a first electric field intensity to a second electric field intensity, the first electric field intensity being smaller than a coercive electric field of the piezoelectric film, the second electric field intensity being larger than the coercive electric field of the piezoelectric film. The piezoelectric film is oriented in the orientation direction from the lower electrode film toward the upper electrode film.

2 Claims, 12 Drawing Sheets

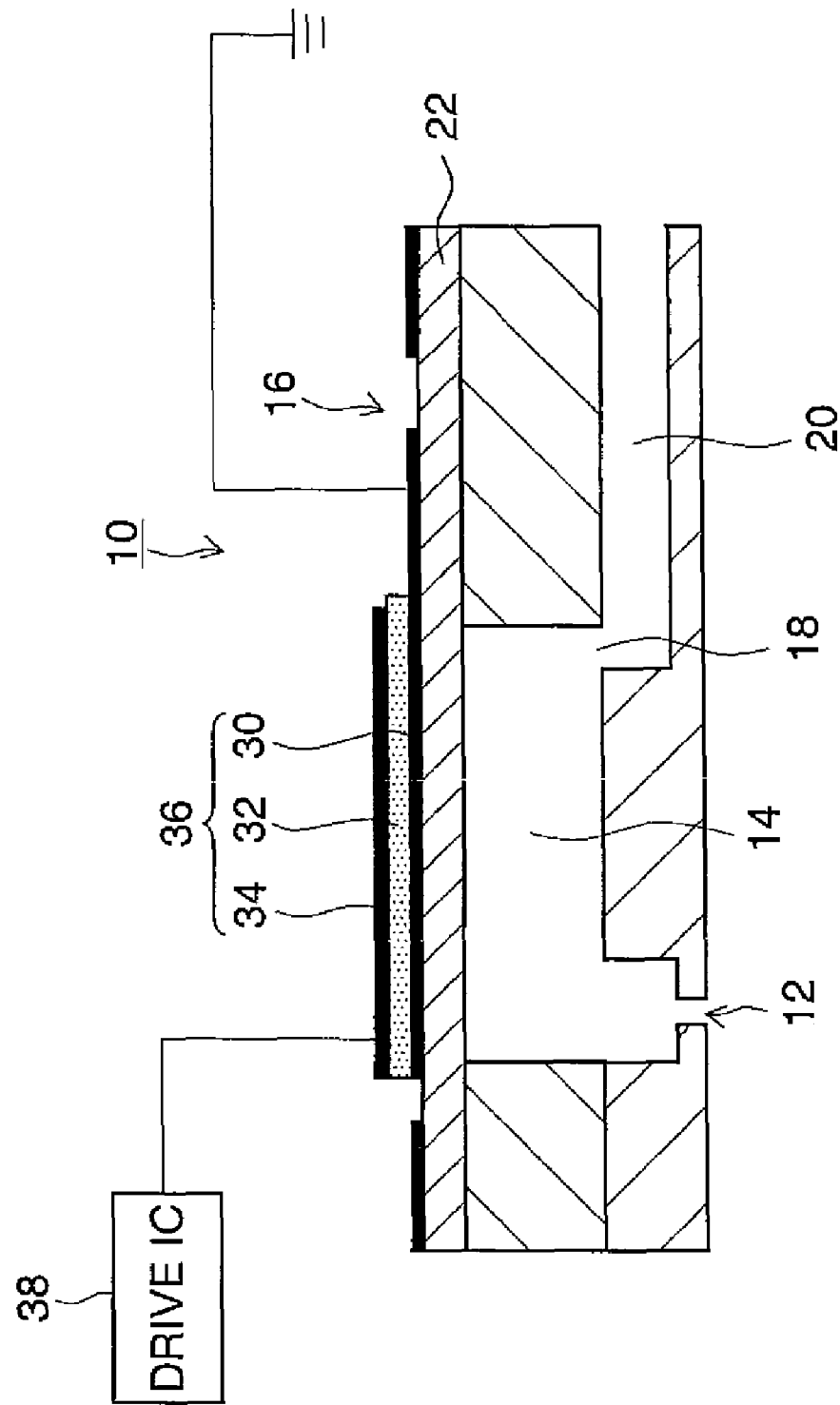

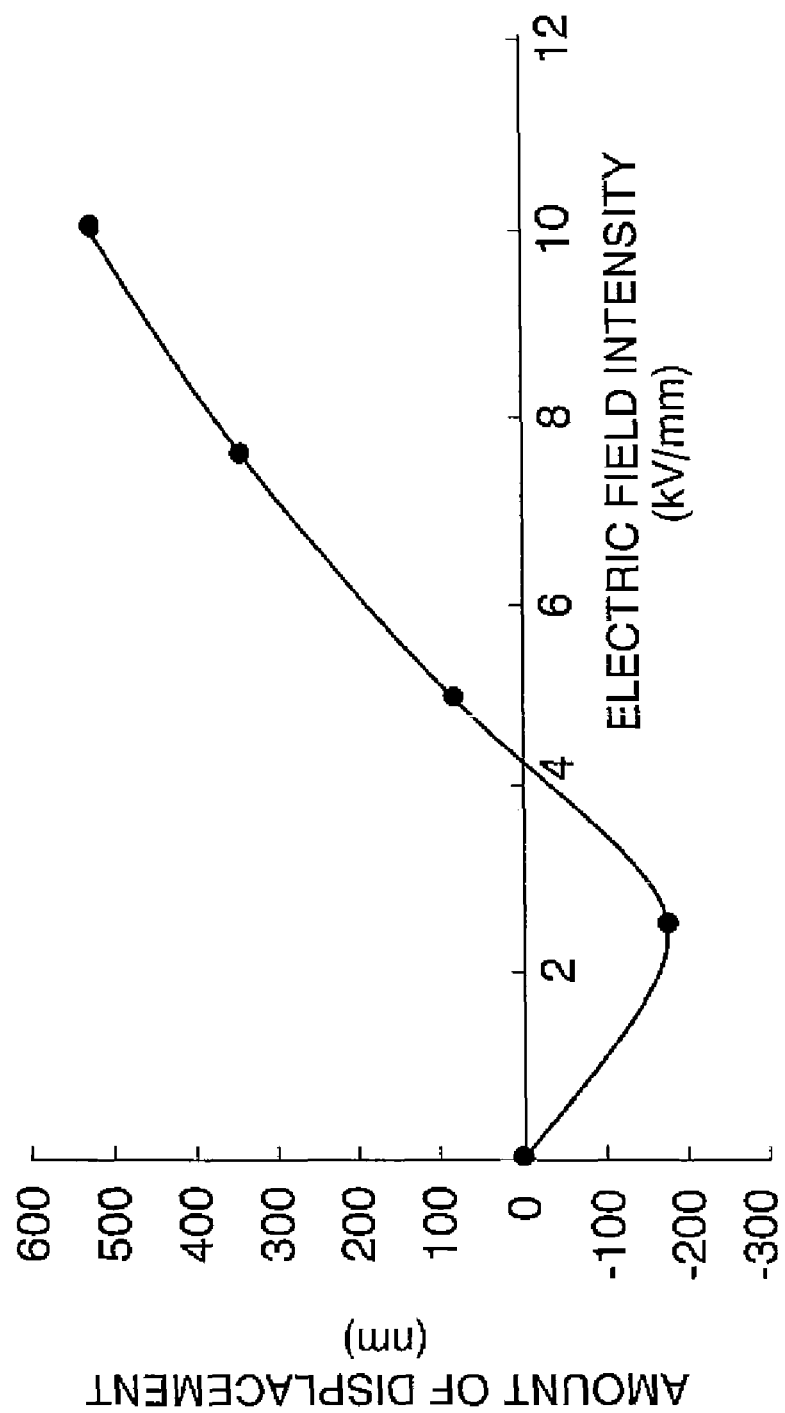

METHOD OF DRIVING PIEZOELECTRIC ACTUATOR AND LIQUID EJECTION APPARATUS

BACKGROUND OF THE INVENTION

1. Field of the Invention

The present invention relates to a method of driving a piezoelectric actuator and a liquid ejection apparatus, and more particularly, to a method of driving a piezoelectric actuator in which an upper electrode film, a piezoelectric film and a lower electrode film are layered successively onto a diaphragm, and to a liquid ejection apparatus which includes the piezoelectric actuator.

2. Description of the Related Art

A piezoelectric actuator having a piezoelectric film provided between an upper electrode film and a lower electrode film has been known in the related art and has been used, for example, in an inkjet recording type of recording head (inkjet head). In general, this piezoelectric actuator has a structure in which a lower electrode film, a piezoelectric film and an upper electrode film are layered successively onto a diaphragm which forms one wall of a pressure chamber, and when an electric field is applied to the piezoelectric film, the piezoelectric film expands or contracts in the direction perpendicular to the thickness direction, causing the diaphragm to deform in a convex shape toward the side of the pressure chamber, and consequently the ink inside the pressure chamber is pressurized, and an ink droplet is ejected from a nozzle connected to the pressure chamber.

In recent years, there has been growing demand for higher quality in the recorded images produced by inkjet recording methods, and one of the technical issues involved in this is enhancing the performance and reliability of piezoelectric actuators. In order to resolve this issue, various technologies have been proposed thus far.

Japanese Patent Application Publication No. 2003-188429 describes a method of forming a crystalline piezoelectric body in which the crystalline structure and the preferentially-oriented plane are controlled by a sputtering technique, or the like, directly after depositing a thin film of piezoelectric material, without carrying out a crystallization process involving heat treatment.

Japanese Patent Application Publication No. 2003-260793 discloses a method for applying to a piezoelectric element an ejection drive signal having an electric potential raising step in which, after an initial electric potential which is a negative potential that is lower than the coercive electric field of the piezoelectric body, the potential is changed continuously to a positive potential which compresses the pressure chamber and causes an ink droplet to be ejected.

A piezoelectric film deposited by a sputtering technique, or the like has an orientation direction, and the orientation direction (the direction from the lower electrode film toward the upper electrode film) is determined at the time of film formation. Such a piezoelectric film produces an amount of displacement that is approximately proportional to the intensity of the applied electric field when an electric field is applied in the same direction as the direction of orientation of the piezoelectric film. On the other hand, when an electric field is applied in the opposite direction to the direction of orientation of the piezoelectric film, the displacement direction of the piezoelectric film is inverted around the coercive electric field of the piezoelectric film. Consequently, in a piezoelectric actuator comprising a piezoelectric film formed by a sputtering technique, or the like, it is common to adopt a composition in which the lower electrode film is used as an individual electrode (address electrode) and the upper electrode film is used as a common electrode (ground electrode), in order to apply an electric field to the piezoelectric film in the same direction as the direction of orientation of the piezoelectric film. This is because, if the upper electrode film is used as an individual electrode, then a negative voltage is required to be supplied to the upper electrode film, and the costs relating to the driver IC and so on increase in comparison with a case where a positive voltage is supplied.

On the other hand, if the lower electrode film is used as an individual electrode, while the upper electrode film is used as a common electrode, and if the diaphragm is made of a silicon substrate, for instance, then a current leakage occurs between the plurality of lower electrode films (individual electrodes), via the diaphragm, and a problem of electrical cross-talk arises, namely, ink droplets are ejected from nozzles where they are not intended to be ejected. Moreover, due to the increase in the electrostatic capacitance, there is also a drawback in that the power consumption increases.

Furthermore, in order to be able to eject very fine liquid droplets in an inkjet recording system, it is necessary to carry out ink ejection by means of a so-called "pull-push" operation, which involves continuously performing an operation of pulling the meniscus inside the nozzle and an operation of pushing the meniscus out from the nozzle. However, in order to achieve ink ejection by means of a "pull-push" operation simply by applying an electric field to the piezoelectric film in one direction only, the drive voltage waveform applied to the piezoelectric actuator becomes complex since, for example, the pressure chamber must first be contracted, and then returned provisionally to its original state and then contracted once again, and this leads to increased costs.

In the method described in Japanese Patent Application Publication No. 2003-188429, the direction of orientation of the piezoelectric body is the direction from the lower electrode toward the upper electrode, and if the upper electrode is used as an individual electrode, then in order to obtain a positive displacement (a displacement toward the side of the pressure chamber), it is necessary to apply a negative voltage to the upper electrode and as described above, this gives rise to increased costs in relation to the drive IC and the power supply, etc. On the other hand, if the lower electrode is used as the individual electrode, then problems of electrical cross-talk arise.

Furthermore, in the method described in Japanese Patent Application Publication No. 2003-260793, it is necessary to apply an electric field in both the same direction and the reverse direction of the direction of orientation of the piezoelectric body. In other words, both a positive and a negative voltage must be applied to the individual electrode (upper electrode or lower electrode), and therefore, similarly to the case of supplying a negative voltage, there is an increase in the costs relating to the drive IC and the like.

SUMMARY OF THE INVENTION

The present invention has been contrived in view of these circumstances, an object thereof being to provide a method of driving a piezoelectric actuator with high performance at low cost, and a liquid ejection apparatus.

In order to attain the aforementioned object, the present invention is directed to a method of driving a piezoelectric actuator which is constituted of a lower electrode film, a piezoelectric film and an upper electrode film that are layered successively onto a diaphragm, the piezoelectric film being oriented in an orientation direction from the lower electrode film toward the upper electrode film, the method comprising the step of: applying an electric field to the piezoelectric film in a direction opposite to the orientation direction of the piezoelectric film while continuously changing an intensity of the electric field from a first electric field intensity to a second electric field intensity, the first electric field intensity being smaller than a coercive electric field of the piezoelectric film, the second electric field intensity being larger than the coercive electric field of the piezoelectric film.

In this aspect of the present invention, it is possible to carry out driving by a "pull-push" operation simply by supplying a drive signal (positive voltage) having a relatively simple waveform to the upper electrode film (individual electrode) of the piezoelectric actuator, and it is possible to lower the costs of the drive IC, and so on, as well as achieving satisfactory displacement characteristics.

Preferably, the above-described method of driving the piezoelectric actuator further comprises the step of: applying an electric field to the piezoelectric film in a direction that is parallel with the orientation direction of the piezoelectric film when the piezoelectric actuator is not being driven.

In this aspect of the present invention, it is possible to restore the displacement characteristics of the piezoelectric actuator.

In order to attain the aforementioned object, the present invention is also directed to a liquid ejection apparatus, comprising: a nozzle which ejects liquid; a pressure chamber which is connected to the nozzle; a diaphragm which constitutes one wall of the pressure chamber; a piezoelectric actuator which is constituted of a lower electrode film, a piezoelectric film and an upper electrode film that are layered successively onto the diaphragm, the piezoelectric film being oriented in an orientation direction from the lower electrode film toward the upper electrode film; and a first electric field application device which applies an electric field to the piezoelectric film in a direction opposite to the orientation direction of the piezoelectric film while continuously changing an intensity of the electric field from a first electric field intensity to a second electric field intensity, the first electric field intensity being smaller than a coercive electric field of the piezoelectric film, the second electric field intensity being larger than the coercive electric field of the piezoelectric film.

In this aspect of the present invention, it is possible to eject very fine droplets by a "pull-push" operation simply by supplying a drive signal (positive voltage) having a relatively simple waveform to the upper electrode film (individual electrode) of the piezoelectric actuator, and it is possible to lower the costs of the drive IC, and so on, as well as improving image quality.

Preferably, the above-described liquid ejection apparatus further comprises a second electric field application device which applies an electric field to the piezoelectric film in a direction that is parallel with the orientation direction of the piezoelectric film when the liquid is not being ejected from the nozzle.

In this aspect of the present invention, it is possible to restore the displacement characteristics of the piezoelectric actuator.

According to the present invention, it is possible to carry out driving by a "pull-push" operation simply by supplying a drive signal (positive voltage) having a relatively simple waveform to the upper electrode film (individual electrode) of the piezoelectric actuator, and it is possible to lower the costs of the drive IC, and so on, as well as achieving satisfactory displacement characteristics.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 1 is a cross-sectional diagram showing one portion of a recording head according to an embodiment of the present invention;

FIG. 2 is a diagram showing the relationship between the electric field intensity and the amount of displacement when an electric field is applied in a direction opposite to the direction of orientation of the piezoelectric film;

DETAILED DESCRIPTION OF THE PREFERRED EMBODIMENTS

Figure 3A:
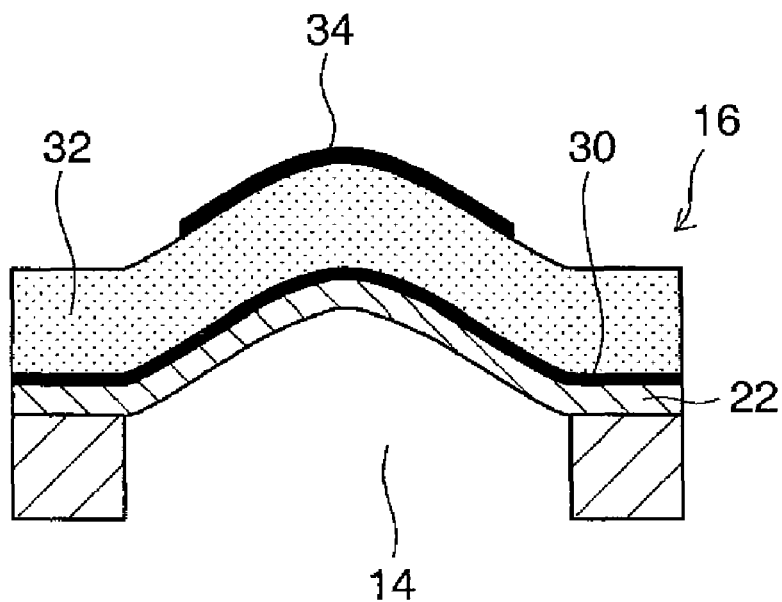
FIGS. 3A and 3B are diagrams showing a schematic view of the displacement of a piezoelectric actuator.

FIG. 1 is a cross-sectional diagram showing the principal composition of a recording head (inkjet head) according to an embodiment of the present invention. As shown in FIG. 1, the recording head 10 according to the present embodiment principally comprises a nozzle 12 which forms an ink ejection port, a pressure chamber 14 which is connected to the nozzle 12, and a piezoelectric actuator 16 which changes the internal volume of the pressure chamber 14.

Although not shown in FIG. 1, a plurality of nozzles 12 are arranged in a two-dimensional arrangement (matrix configuration) on the ejection face (nozzle surface) of the recording head 10. The pressure chambers 14 corresponding respectively to the nozzles 12 are provided inside the recording head 10, and each nozzle 12 is connected respectively to the corresponding pressure chamber 14. An ink supply port 18 is formed at one end of each of the pressure chambers 14 (the end on the opposite side to the side where the nozzle 12 is connected in FIG. 1). The respective pressure chambers 14 are connected to a common flow channel 20 via the ink supply ports 18, and the ink inside the common flow channel 20 is thereby distributed and supplied to the respective pressure chambers 14. Ink is supplied to the common flow channel 20 from an ink tank (not illustrated) which is arranged in the ink storing and loading unit 214 shown in FIG. 8.

The piezoelectric actuator 16 shown in FIG. 1 has a structure in which a lower electrode film 30, a piezoelectric film 32 and an upper electrode film 34 are successively layered on the diaphragm 22, which constitutes a wall of the pressure chamber 14 (the upper surface of the pressure chamber 14 in FIG.

1). As shown in FIG. 1, the lower electrode film 30, the piezoelectric film 32 and the upper electrode film are arranged at a position corresponding to each of the pressure chambers 14. The lower electrode film 30, the piezoelectric film 32 and the upper electrode film 34 corresponding to each of the pressure chambers 14 constitute a piezoelectric element 36 which functions as a pressure generating device that applies pressure to the ink inside the pressure chamber 14.

The piezoelectric film 32 is a piezoelectric film (PZT film) made of lead zirconate titanate (PZT) which has an orientation direction from the lower electrode film 30 toward the upper electrode film 34, and this film is formed by sputtering, sol gelation, CVD, or the like. Desirably, the piezoelectric film 32 is a perovskite type oxide which is preferentially oriented in the (100) face or the (001) face of a cubic system or a tetragonal system, since this makes it possible to obtain a large amount of displacement.

The lower electrode film 30 and the upper electrode film 34 are made of an electrode material such as iridium (Ir), platinum (Pr), tungsten (W), gold (Au), silver (Ag), copper (Cu), titanium (Ti), and the like. In the present embodiment, a structure is adopted in which the upper electrode film 34 forms the individual electrode (address electrode) and the lower electrode film 30 forms the common electrode (ground electrode) (i.e., an upper address structure is adopted in the present embodiment), and the lower electrode film (common electrode) 30 is connected to earth (grounded).

The upper electrode film (individual electrode) 34 is connected electrically to a drive IC 38 via external wiring (for example, a flexible cable, or the like). This drive IC 38 supplies a positive voltage (in other words, it is a so-called positive drive IC). The positive drive IC is beneficial in that it is less expensive than a drive IC supplying a negative voltage. By supplying a positive voltage from the drive IC 38 to the upper electrode film 34, an electric field is applied to the piezoelectric film (PZT film) 32 that has been deposited by sputtering, in a direction opposite to the orientation direction (i.e., the direction from the lower electrode film 30 toward the upper electrode film 34) of the piezoelectric film 32.

Figure 3B:
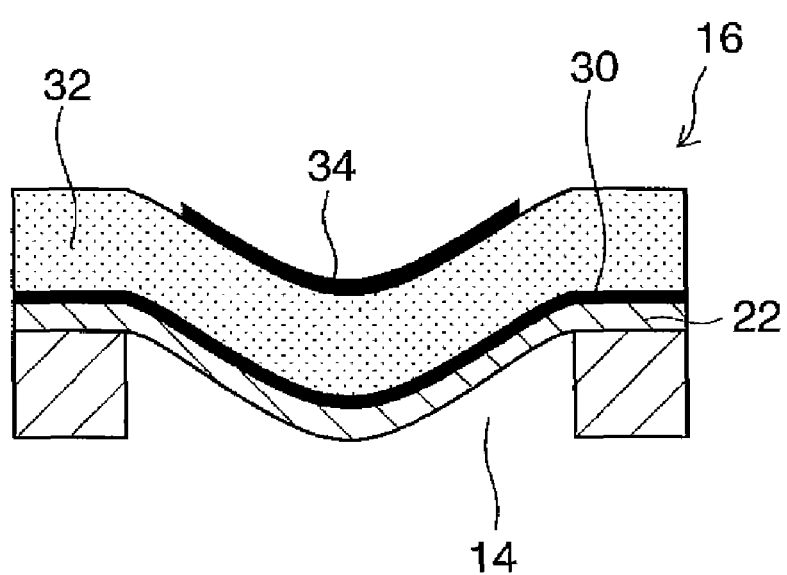

FIG. 2 is a diagram showing the relationship between the electric field intensity and the amount of displacement when an electric field is applied in the direction opposite to the direction of orientation of the piezoelectric film 32 which has been deposited by sputtering. Furthermore, FIGS. 3A and 3B are schematic drawings of a mode of the displacement of the piezoelectric actuator 16. In FIG. 2, the "amount of displacement" indicates the maximum amount of displacement from the initial state of the diaphragm 22 (a state where no electric field is applied), when the direction from the upper electrode film 34 toward the lower electrode film 30 (the downward direction in FIG. 2) is taken as the positive direction. The same applies to FIGS. 4 and 5 described below.

As shown in FIG. 2, when an electric field is applied in the direction opposite to the direction of orientation of the piezoelectric film 32 which has been formed by sputtering, the piezoelectric film 32 displays characteristics whereby the direction of displacement of the diaphragm 22 is inverted around the coercive electric field value of the piezoelectric film 32 (an electric field intensity of approximately 2.5 kV/mm). In other words, when the electric field intensity is increased gradually, then the diaphragm 22 is first displaced in the direction which expands the pressure chamber 14 while the electric field intensity is smaller than the coercive electric field of the piezoelectric film 32, and the diaphragm 22 then starts to be displaced in the direction which contracts the pressure chamber 14 when the electric field intensity becomes larger than the coercive electric field of the piezoelectric film 32.

Consequently, when the electric field intensity is small (from zero to approximately 4.3 kV/mm), then the amount of displacement of the diaphragm 22 is negative and hence the diaphragm 22 assumes a convex shape toward the side opposite to the pressure chamber 14 as shown in FIG. 3A (i.e., the diaphragm 22 deforms to be displaced toward the side opposite to the pressure chamber 14). On the other hand, when the electric field intensity is large (approximately 4.3 kV/mm upwards), then the amount of displacement of the diaphragm 22 is positive and hence the diaphragm 22 assumes a convex shape toward the pressure chamber 14 as shown in FIG. 3B (i.e., the diaphragm 22 deforms to be displaced toward the side of the pressure chamber 14).

Figure 4:
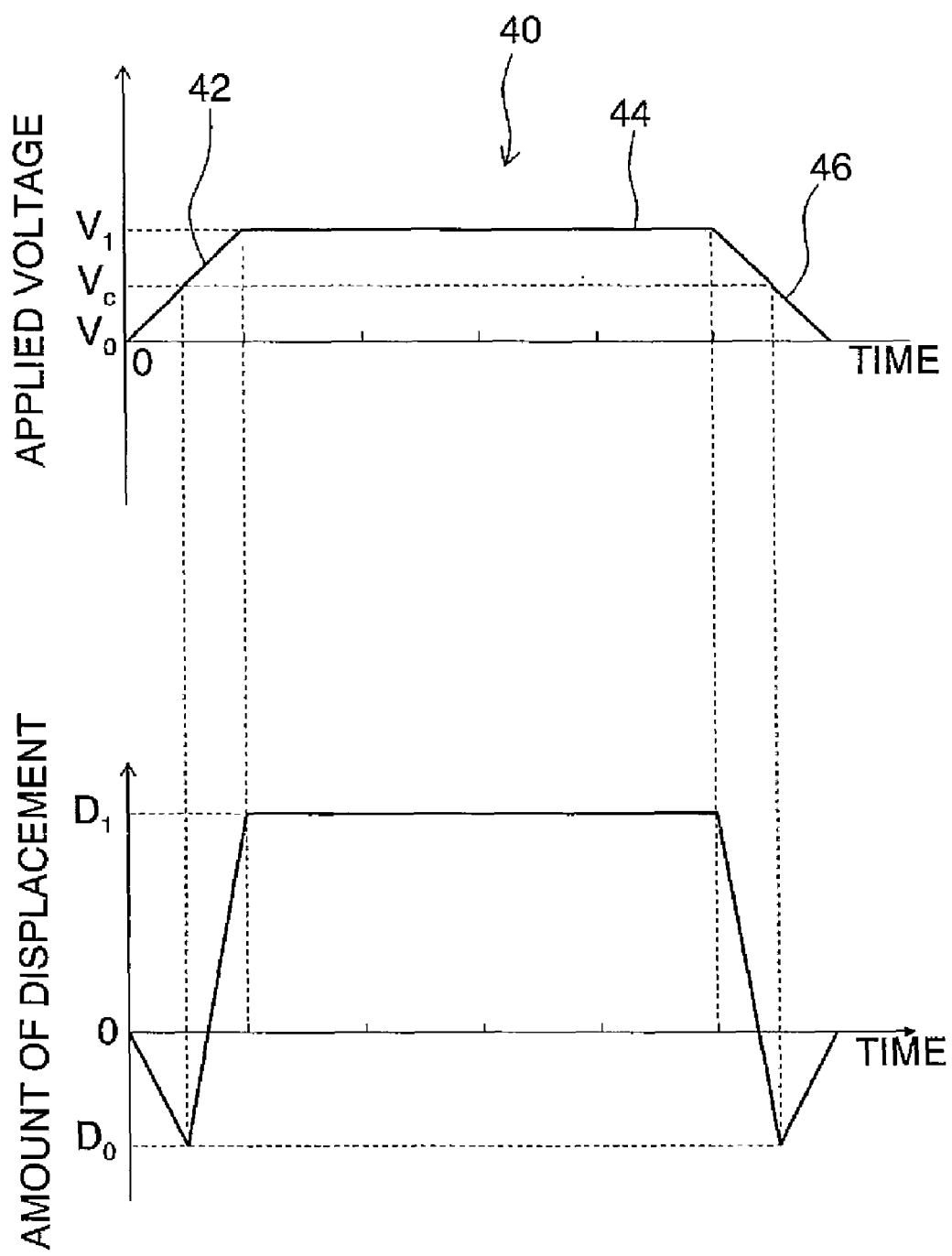
FIG. 4 is a diagram showing a relationship between the drive signal supplied to a piezoelectric actuator and amount of displacement.

FIG. 4 is a diagram showing the relationship between the drive signal which is supplied to the upper electrode film (individual electrode) 34 of the piezoelectric actuator 16 and the amount of displacement. The drive signal 40 shown in the upper portion of FIG. 4 is a trapezoidal pulse waveform (voltage waveform) which is composed of a rising waveform 42 in which the voltage rises from a minimum potential $V_0$ which is the initial potential, to a maximum potential $V_1$, a maintaining waveform 44 which maintains the maximum potential $V_1$, and a falling waveform 46 in which the voltage falls from the maximum potential $V_1$ to the minimum potential $V_0$. Furthermore, taking $V_C$ to be the potential at which the coercive electric field of the piezoelectric film 32 is generated, then the drive signal 40 satisfies conditions that the minimum potential $V_0$ is lower than the potential $V_C$ and the potential $V_C$ is lower than the maximum potential $V_1$ (in other words, $V_0<V_C<V_1$). Here, the minimum potential $V_0$ is taken to be not lower than 0 V (an example of $V_0=0$ V is shown in FIG. 4) Furthermore, the maximum potential $V_1$ is a potential at which the amount of displacement is positive (a potential at which the diaphragm 22 assumes a concave shape toward the pressure chamber 14 side) when the electric field is applied in a direction opposite to the orientation direction of the piezoelectric film 32.

When the drive signal 40 shown in the upper portion of FIG. 4 is supplied to the upper electrode film (individual electrode) 34 of the piezoelectric actuator 16, the diaphragm 22 of the piezoelectric actuator 16 is first displaced in the direction which expands the pressure chamber 14 while the potential of the upper electrode film 34 rises from the minimum potential $V_0$ until the potential $V_C$, and the diaphragm 22 is then displaced in the direction which contracts the pressure chamber 14 while the potential increases from the potential $V_C$ until the maximum potential $V_1$, in accordance with the rising waveform 42.

In other words, as shown in the lower portion of FIG. 4, the diaphragm 22 of the piezoelectric actuator 16 is first deformed from its initial state (amount of displacement 0 nm) to the minimum displacement $D_0$ (where $D_0<0$), due to the rising waveform 42. In this case, the pressure chamber 14 expands (see FIG. 3A) and the meniscus (ink meniscus) inside the nozzle 12 is drawn temporarily inside the pressure chamber 14. Subsequently, the diaphragm 22 of the piezoelectric actuator 16 deforms from the minimum displacement $D_0$ to the maximum displacement $D_1$ (where $D_1>0$). In this case, the pressure chamber 14 contracts (see FIG. 3B), the ink inside the pressure chamber 14 is pressurized, and an ink droplet is ejected from the nozzle 12.

In other words, when an electric field is applied in the opposite direction to the direction of orientation of the piezoelectric film 32, it is possible to perform expansion and contraction of the pressure chamber 14 in a continuous fashion, simply by applying to the piezoelectric film 32 an electric field that changes in a continuous fashion from a first electric field intensity (corresponding to the minimum displacement $D_0$) which is lower than the coercive electric field of the piezoelectric film 32 to a second electric field intensity (corresponding to the maximum displacement $D_1$) which is higher than the coercive electric field of the piezoelectric film 32.

Thereupon, after the potential of the upper electrode film 34 has been maintained at the maximum potential $V_1$ for a prescribed period of time by means of the maintaining waveform 44, the diaphragm 22 of the piezoelectric actuator 16 deforms from the maximum displacement $D_1$ to the minimum displacement $D_0$ (see FIG. 3A) while the potential of the upper electrode film 34 falls from the maximum potential $V_1$ to the potential $V_C$, and the diaphragm 22 returns to its original state from the minimum displacement $D_0$ while the potential falls from the potential $V_C$ to the minimum potential $V_0$, in accordance with the falling waveform 46.

According to the driving method of the present embodiment, it is possible to expand and contract the pressure chamber 14 in a continuous fashion and thus perform ink ejection by means of a so-called "push-pull" operation, by utilizing the characteristics which arise when an electric field is applied in the direction opposite to the direction of orientation of the piezoelectric film 32 and by supplying a drive signal (positive voltage) having a relative simple waveform to the upper electrode film (individual electrode) 34 from a positive drive IC. As a result, it is possible to reduce the cost of the drive IC, and it is also possible to obtain satisfactory ejection characteristics.

By performing ink ejection by a "pull-push" operation, it is possible to eject very fine liquid droplets and therefore image quality can be improved. Furthermore, it is also possible to drive the piezoelectric actuators 16 at high frequency, and it is also possible to enhance the recording speed achieved by the recording head 10.

Figure 11:
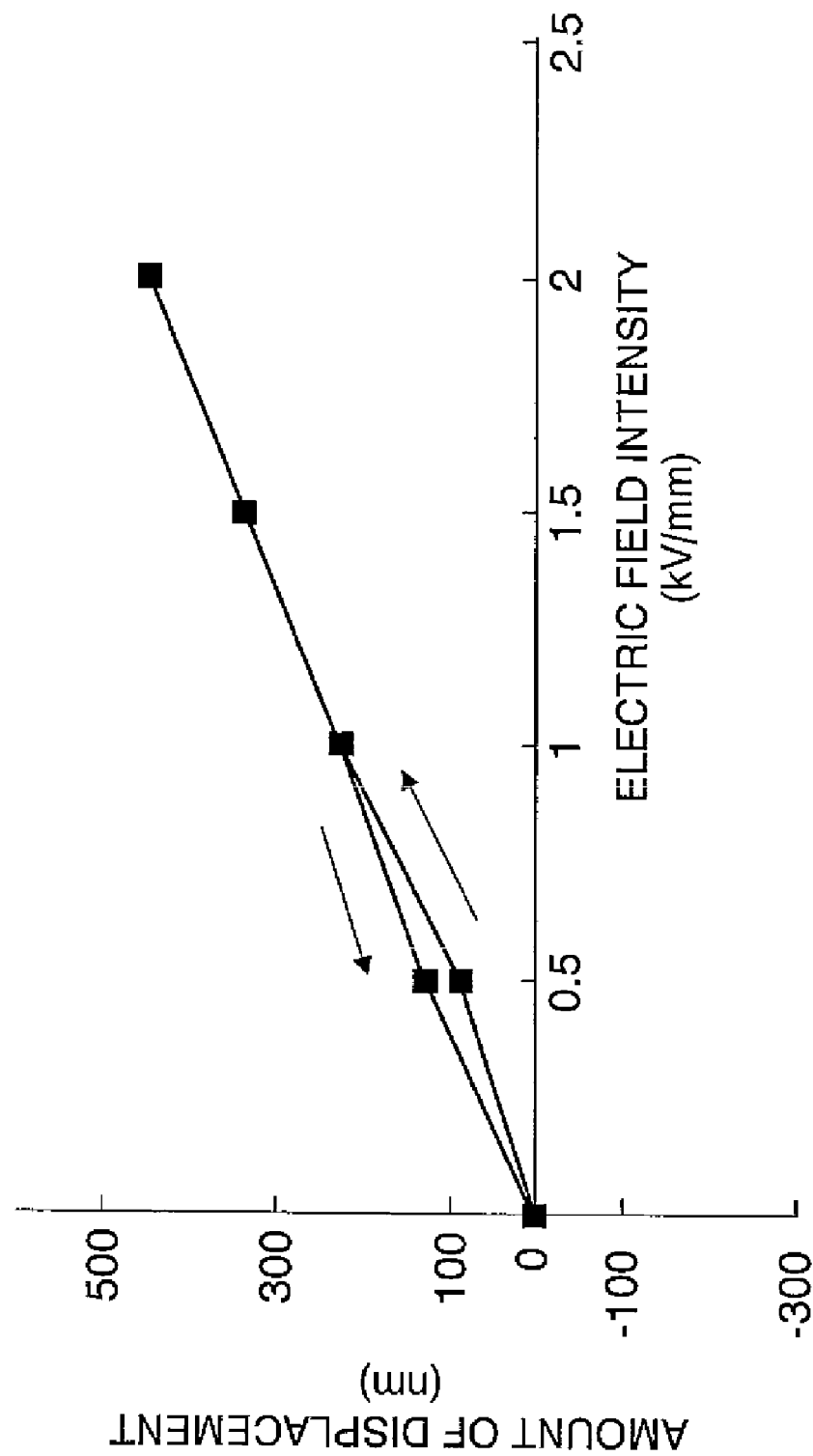
FIG. 11 is a diagram showing the relationship between the electric field intensity and the amount of displacement when an electric field is applied in a direction opposite to the direction of polarization of a bulk piezoelectric body.

If, on the other hand, an electric field is applied in the direction opposite to the direction of polarization of a bulk piezoelectric body, then it is not possible to obtain behavior such as that of the piezoelectric film 32 which has been deposited by sputtering. If an electric field is applied in the direction opposite to the direction of polarization of a bulk piezoelectric body, then as shown in FIG. 11, the amount of displacement gradually increases as the electric field intensity rises, and therefore it is not possible to displace the diaphragm 22 toward the negative side (the side opposite to the pressure chamber 14). In other words, it is not possible to perform ink ejection by a "pull-push" operation by means of a relatively simple waveform such as that shown in FIG. 4. Furthermore, in a bulk piezoelectric body, the amount of displacement varies depending on whether the electric field intensity is increasing or decreasing.

Figure 5:
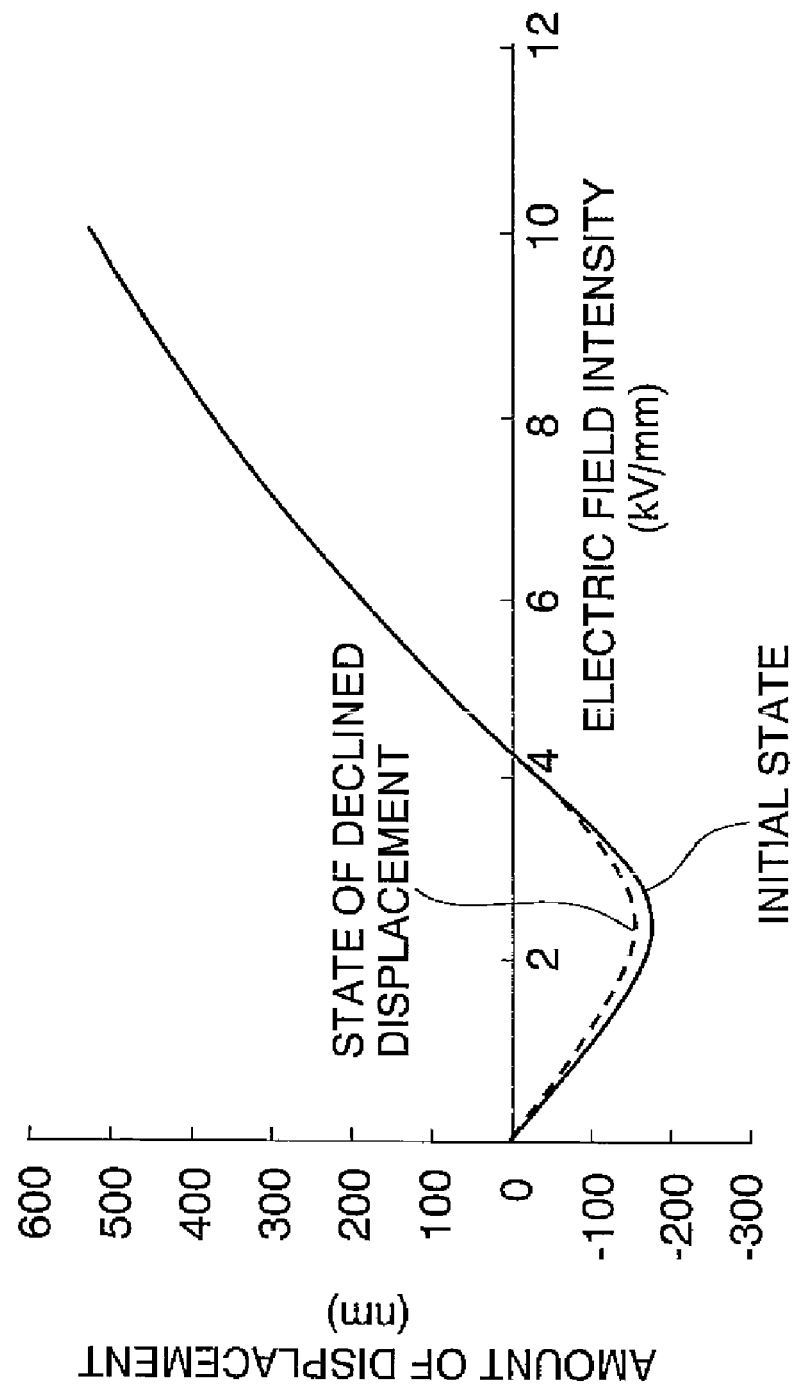
FIG. 5 is a diagram showing the change in the amount of displacement when an electric field is applied in a direction opposite to the direction of orientation of the piezoelectric film.

When the drive method according to the present embodiment is repeated, the displacement characteristics of the piezoelectric actuator 16 may vary due to the effects of the electric field which is applied in the direction opposite to the direction of orientation of the piezoelectric film 32, and the amount of displacement toward the side opposite to the pressure chamber 14 may decrease compared to its initial state. FIG. 5 is a diagram showing the state of change in the amount of displacement when an electric field is applied in the direction opposite to the direction of orientation of the piezoelectric film 32; the solid line represents an initial state and the dotted line represents a state where the amount of displacement has declined. As shown in FIG. 5, when the amount of negative displacement in the direction opposite to the pressure chamber 14 has declined, then it is possible to restore the displacement characteristics of the piezoelectric actuator 16 to the initial state by applying an electric field in a direction that is parallel with the orientation direction of the piezoelectric film 32. Consequently, from the viewpoint of preventing change in the displacement characteristics of the piezoelectric actuator 16 described above in advance, it is desirable to apply an electric field in a direction that is parallel with the orientation direction of the piezoelectric film 32, at periodic or irregular intervals, when the piezoelectric actuator 16 is not being driven (when ink ejection is not being performed).

Figure 6:
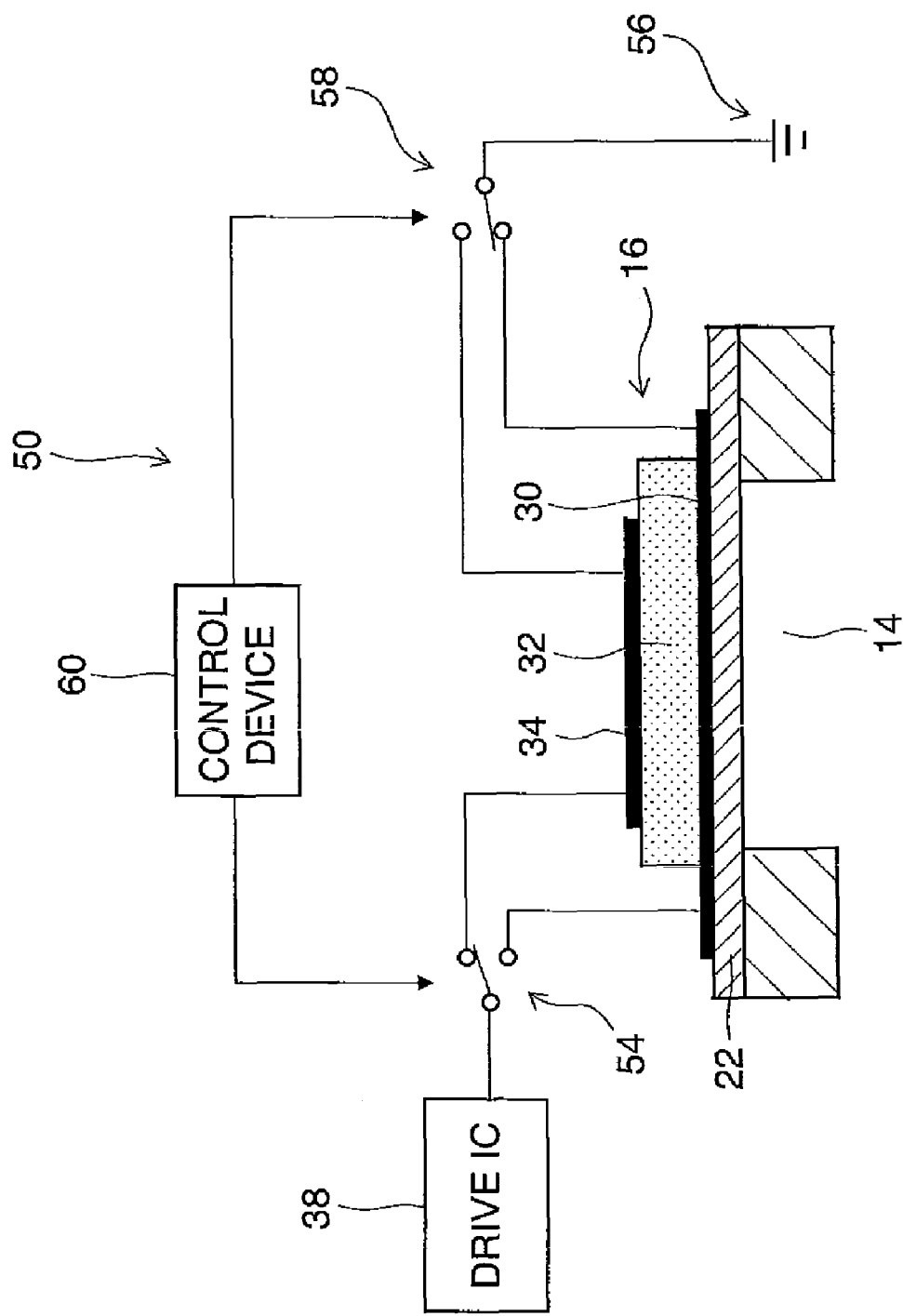
FIG. 6 is a diagram showing a mechanism for restoring the displacement characteristics of a piezoelectric actuator.

FIG. 6 is an approximate diagram showing a mechanism for restoring the displacement characteristics of the piezoelectric actuator 16 (displacement characteristics restoring mechanism). The displacement characteristics restoring mechanism 50 shown in FIG. 6 principally comprises: a first switch device 54 which is capable of switching the supply destination of the drive signal (positive voltage) supplied by the positive drive IC 38, between the upper electrode film 34 and the lower electrode film 30; a second switch device 58 which is capable of switching the connection destination of an earthing device 56 between the upper electrode film 34 and the lower electrode film 30; and a control device 60 which controls the switching of the first and second switching devices 54 and 58. The first switching device 54 is usually set to the side of the upper electrode film 34 thereby forming an electrical connection between the drive IC 38 and the upper electrode film 34, and the second switching device 58 is set to the side of the lower electrode film 30, thereby forming an electrical connection between the earthing device 56 and the lower electrode film 30. When it is judged that the displacement characteristics of the piezoelectric actuator 16 need to be restored, the control device 60 switches the first switch device 54 to the side of the lower electrode film 30, thereby forming an electrical connection between the drive IC 38 and the lower electrode film 30, and also switches the second switch device 58 to the side of the upper electrode film 34, thereby forming an electrical connection between the earthing device 56 and the upper electrode film 34. For example, it is possible to perform switching whenever a prescribed reference time period has elapsed from the previous switching operation, and it also possible to perform switching when the number of drive operations of the piezoelectric actuator 16 has exceeded a reference value. By applying an electric field in a direction that is parallel with the orientation direction of the piezoelectric film 32 in this way, either at periodic intervals or irregular intervals, it is possible to restore the displacement characteristics of the piezoelectric actuator 16.

Next, the method of manufacturing the recording head 10 of the present embodiment will be described with reference to FIGS. 7A to 7J.

Figure 7A:
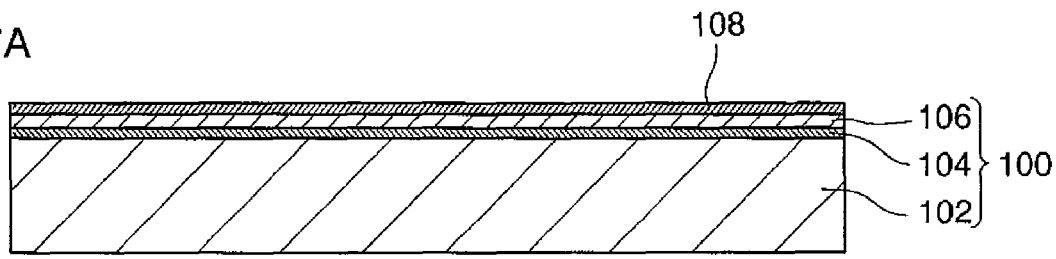
FIGS. 7A to 7J are step diagrams showing a method of manufacturing a recording head according to an embodiment of the present invention.

Firstly, an SOI substrate 100 having an insulating layer 108 formed on the surface thereof is prepared (FIG. 7A). The SOI substrate 100 is a multiple-layer substrate which comprises a supporting layer 102 constituted by a silicon substrate (Si substrate), a box layer 104 constituted by a silicon oxide film ($SiO_2$ film), and an active layer 106 constituted by a silicon substrate (Si substrate). The insulating film 108 is constituted by a silicon oxide film ($SiO_2$ film), and it can be formed by an oxidation method, a sputtering technique, a CVD technique, or the like. In stead of a silicon oxide, the insulating layer 108 may be constituted by an oxide, such as $ZrO_2$, $Al_2O_3$, or the like, a nitride, such as SiCN, TiAlN, $Si_3N_4$ or TiAlCrN, an oxynitride, such as SiON, a resin, or the like.

Figure 7B:
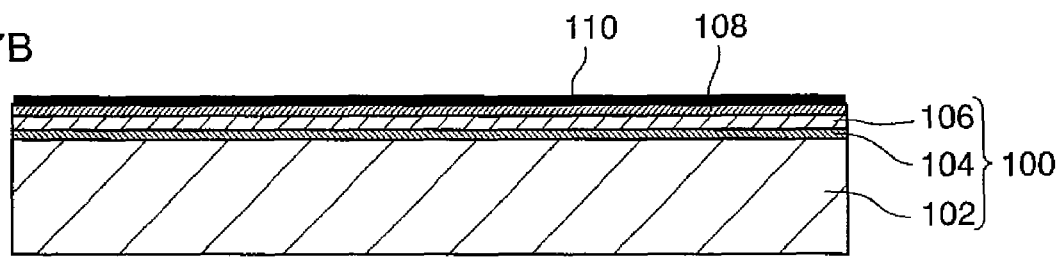
Figure 7C:
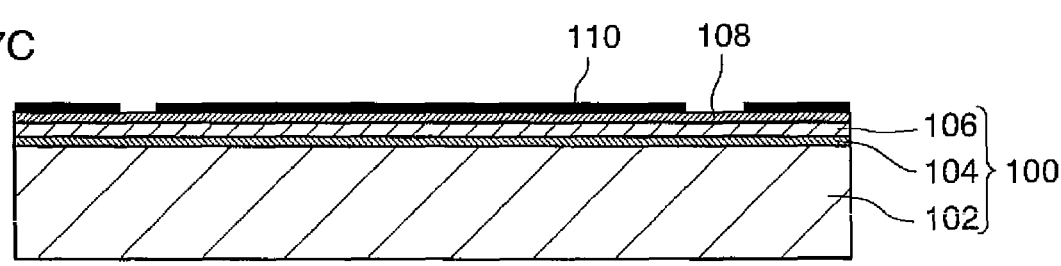

Next, a lower electrode film 110 is formed over the whole surface of the insulating layer 108 (FIG. 7B). The material of the lower electrode film 110 may be an electrode material, such as Ir, Pt or Ti. A method such as sputtering, vapor deposition, CVD, or the like, may be used to form the lower electrode film 110. The thickness of the lower electrode film 110 is 100 nm through 300 nm, for example. Subsequently the lower electrode film 110 is patterned by etching (FIG. 7C). More specifically, the lower electrode film 110 is divided into individual areas for the respective pressure chambers 14 (see FIG. 1) by dry etching (RIE). Instead of a step of forming the lower electrode film 110 over an entire surface of the insulating layer 108 and then etching same, it is also possible to form a lower electrode film 110 at each of the positions corresponding to the pressure chambers 14, by means of a liftoff film deposition method which uses a resist.

Figure 7D:
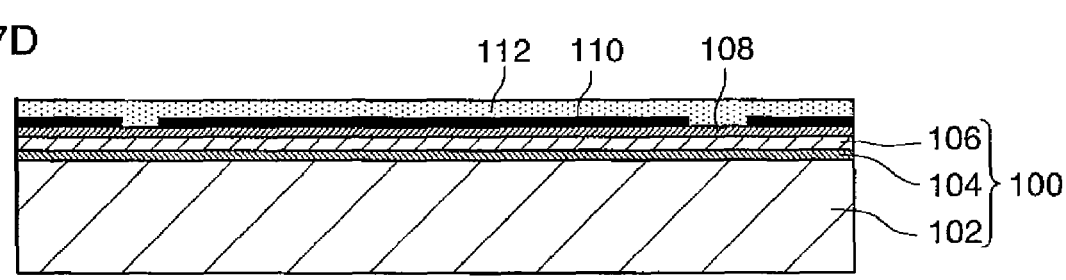

Next, a piezoelectric film 112 is formed on the upper surface of the SOI substrate 100, so as to cover the lower electrode film 110 which is situated on the insulating layer 108 (FIG. 7D). More specifically, a piezoelectric film 112 which is preferentially oriented in the direction from the lower electrode film 110 toward the upper electrode film 114 (see FIG. 7E) is deposited. This piezoelectric film 112 is preferably a perovskite type oxide which is preferentially oriented in the (100) face or the (001) face of a cubic system or a tetragonal system. The piezoelectric film 112 having an orientation of this kind may be deposited by means of sputtering, sol gelation, CVD, or the like. In the present example, a piezoelectric film (PZT film) 112 made of lead zirconate titanate (Pb (Ti, Zr) $O_3$) is deposited by sputtering. The film deposition conditions (sputtering conditions) may be as follows: film formation temperature of the piezoelectric film 112 (substrate temperature) is 450° C., total gas pressure is 0.3 Pa, and sputter power is 600 W. Furthermore, the film thickness of the piezoelectric film 112 is 1 µm through 5 µm, for example.

Figure 7E:
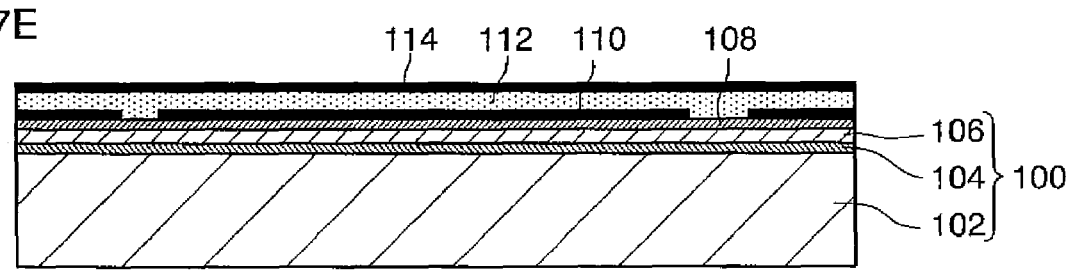

Next, an upper electrode film 114 is formed over the whole surface of the piezoelectric film 112 (FIG. 7E). The material of the upper electrode film 114 may be an electrode material, such as Ir, Pt, Ti, or Au. The upper electrode film 114 may be formed by a method such as sputtering, vapor deposition, CVD, or the like. The thickness of the upper electrode film 114 is 100 nm through 300 nm, for example.

Figure 7F:
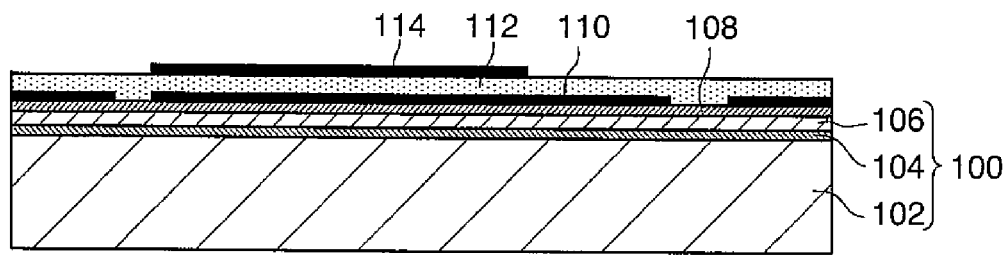

Next, the upper electrode film 114 is patterned by etching (FIG. 7F). More specifically, the upper electrode film 114 is patterned by dry etching (RIE) which uses a fluorine gas or chlorine gas. Instead of a step of forming the upper electrode film 114 over an entire surface of the piezoelectric film 112 and then etching same, it is also possible to form the upper electrode film 114 on the piezoelectric film 112 by means of a lift-off film deposition technique which uses a resist.

Figure 7G:
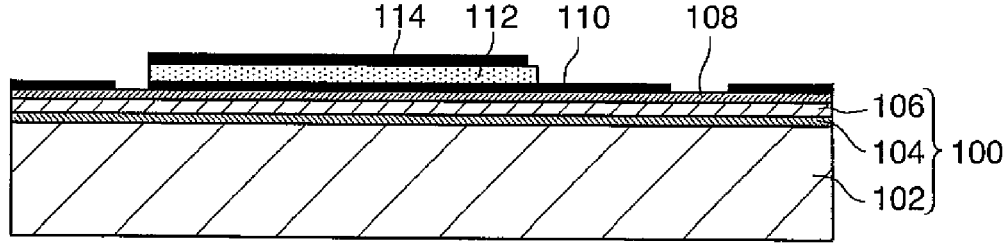

Next, the piezoelectric film 112 is patterned by etching (FIG. 7G). More specifically, similarly to the upper electrode film 114, the lower electrode film 114 is patterned by dry etching (RIE) which uses a fluorine gas or chlorine gas. In this case, it is desirable that etching should be performed in such a manner that the piezoelectric film 112 is removed completely from the insulating layer 108, and hence detachment of the piezoelectric film 112 can be prevented. Furthermore, although not shown in the drawings, a mode is also possible in which the upper electrode film 114 and the piezoelectric film 112 are etched simultaneously.

Figure 7H:
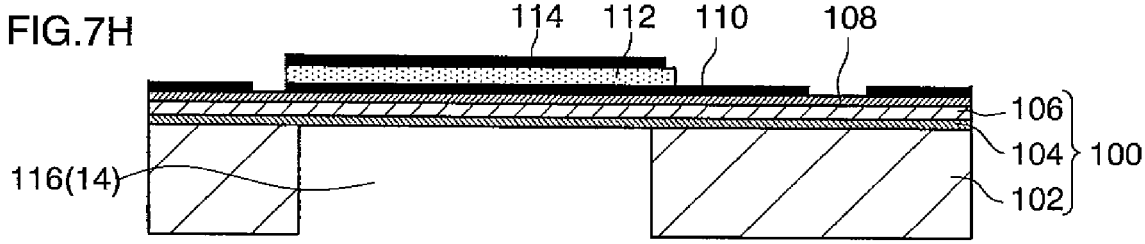
Figure 7I:
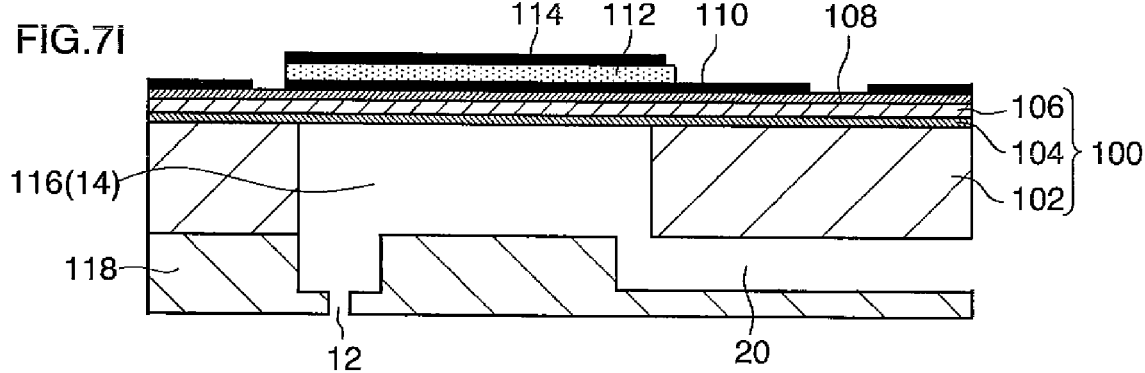

Next, an opening section 116 which is to form a pressure chamber 14 is formed by etching, or the like, in the supporting body (silicon substrate) 102 which constitutes the lower surface side of the SOI substrate 100 (FIG. 7H). Subsequently, a flow channel forming substrate 118 in which nozzles 12 and a common flow channel 20, and the like, are formed is bonded onto the lower surface side of the SOI substrate 100 (FIG. 7I).

Figure 7J:
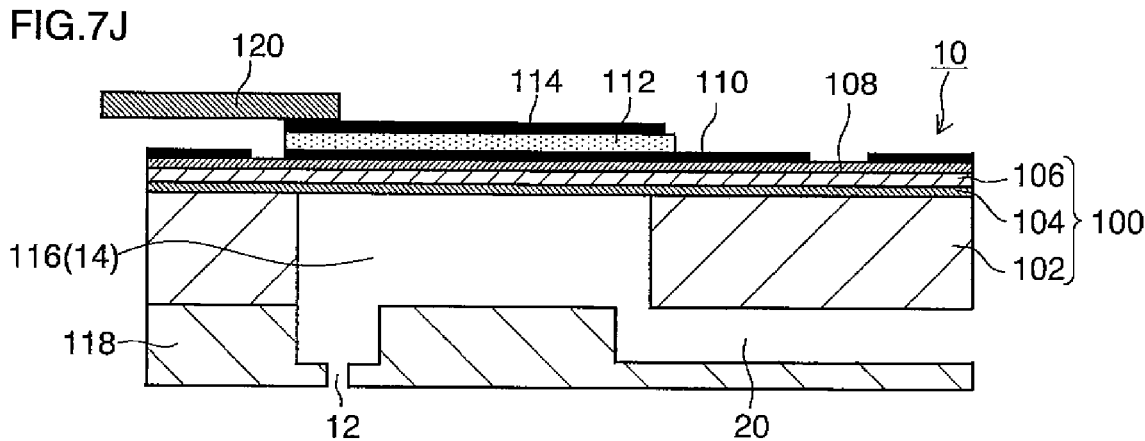

Finally, one end of the external wire 120 is bonded to the upper electrode film 114 by means of a conductive adhesive, whereby it is possible to obtain the recording head 10 according to the present embodiment (FIG. 7J).

Figure 8:
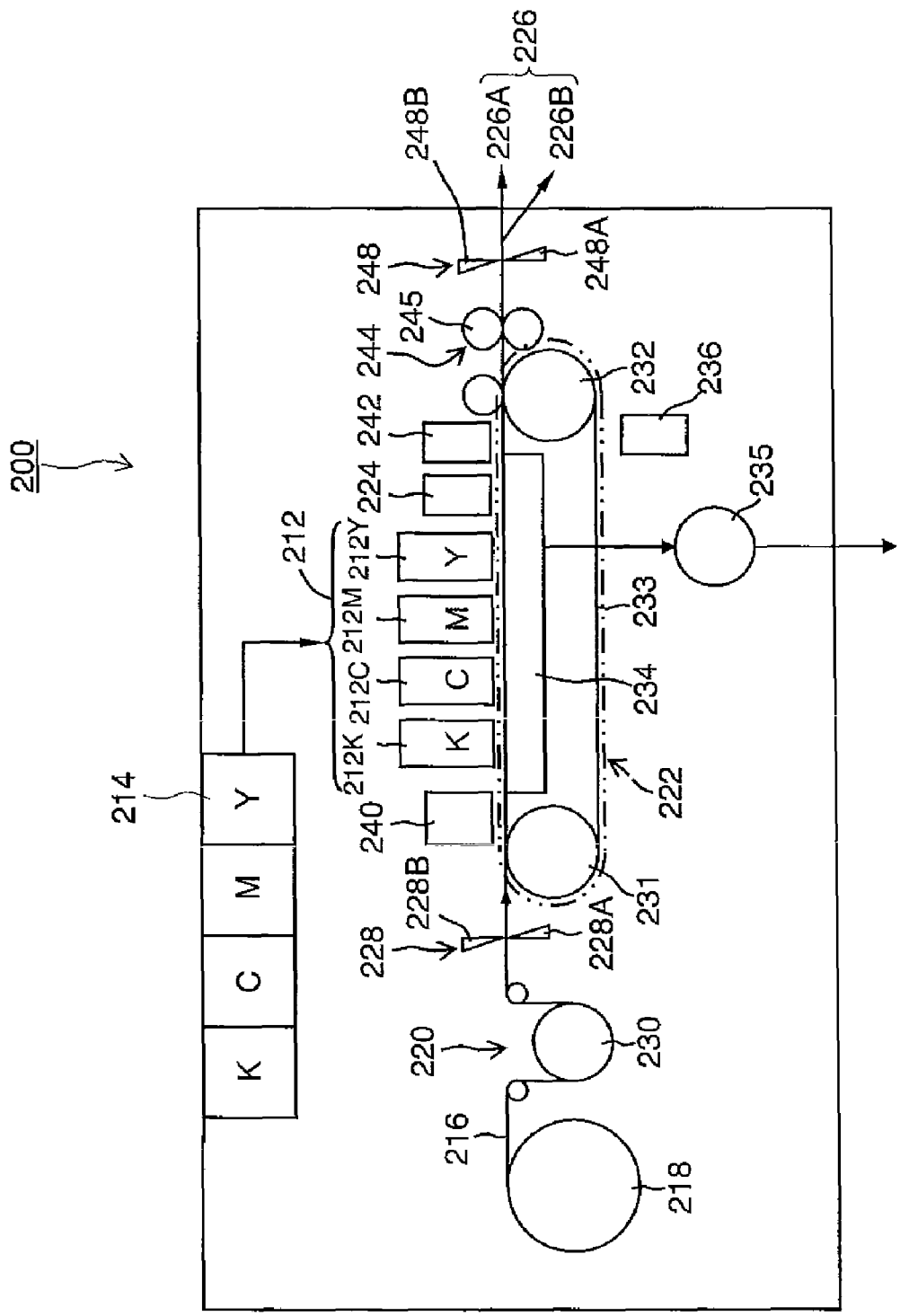
FIG. 8 is a general schematic drawing showing a general view of an inkjet recording apparatus.

FIG. 8 is a general schematic drawing showing a general view of an inkjet recording apparatus. As shown in FIG. 8, the inkjet recording apparatus 200 comprises: a print unit 212 having a plurality of recording heads 212K, 212C, 212M and 212Y for ink colors of black (K), cyan (C), magenta (M), and yellow (Y), respectively; an ink storing and loading unit 214 for storing inks of K, C, M and Y to be supplied to the print heads 212K, 212C, 212M and 212Y; a paper supply unit 218 for supplying recording paper 216; a decurling unit 220 for removing curl in the recording paper 216; a suction belt conveyance unit 222 disposed facing the nozzle face (ink droplet ejection face) of the print unit 212, for conveying the recording paper 216 while keeping the recording paper 216 flat; a print determination unit 224 for reading the printed result produced by the print unit 212; and a paper output unit 226 for outputting image-printed recording paper (printed matter) to the exterior. The recording heads 212K, 212C, 212M and 212Y correspond respectively to the recording head 10 shown in FIG. 1.

In FIG. 8, a magazine for rolled paper (continuous paper) is shown as an example of the paper supply unit 218; however, more magazines with paper differences such as paper width and quality may be jointly provided. Moreover, papers may be supplied with cassettes that contain cut papers loaded in layers and that are used jointly or in lieu of the magazine for rolled paper.

In the case of the configuration in which roll paper is used, a cutter 228 is provided as shown in FIG. 8, and the continuous paper is cut into a desired size by the cutter 228. The cutter 228 has a stationary blade 228A, whose length is not less than the width of the conveyor pathway of the recording paper 216, and a round blade 228B, which moves along the stationary blade 228A. The stationary blade 228A is disposed on the reverse side of the printed surface of the recording paper 216, and the round blade 228B is disposed on the printed surface side across the conveyor pathway. When cut papers are used, the cutter 228 is not required.

In the case of a configuration in which a plurality of types of recording paper can be used, it is preferable that an information recording medium such as a bar code and a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 216 delivered from the paper supply unit 218 retains curl due to having been loaded in the magazine. In order to remove the curl, heat is applied to the recording paper 216 in the decurling unit 220 by a heating drum 230 in the direction opposite from the curl direction in the magazine. The heating temperature at this time is preferably controlled so that the recording paper 216 has a curl in which the surface on which the print is to be made is slightly round outward.

The decurled and cut recording paper 216 is delivered to the suction belt conveyance unit 222. The suction belt conveyance unit 222 has a configuration in which an endless belt 233 is set around rollers 231 and 232 so that the portion of the endless belt 233 facing at least the nozzle face of the print unit 212 and the sensor face of the print determination unit 224 forms a plane.

The belt 233 has a width that is greater than the width of the recording paper 216, and a plurality of suction apertures (not shown) are formed on the belt surface. A suction chamber 234 is disposed in a position facing the sensor surface of the print determination unit 224 and the nozzle surface of the print unit 212 on the interior side of the belt 233, which is set around the rollers 231 and 232, as shown in FIG. 8. The suction chamber 234 provides suction with a fan 235 to generate a negative pressure, and the recording paper 216 is held on the belt 233 by suction.

The belt 233 is driven in the clockwise direction in FIG. 8 by the motive force of a motor (not shown) being transmitted to at least one of the rollers 231 and 232, which the belt 233 is set around, and the recording paper 216 held on the belt 233 is conveyed from left to right in FIG. 8.

Since ink adheres to the belt 233 when a marginless print job or the like is performed, a belt-cleaning unit 236 is disposed in a predetermined position (a suitable position outside the printing area) on the exterior side of the belt 233. Although the details of the configuration of the belt-cleaning unit 236 are not shown, examples thereof include a configuration in which the belt 233 is nipped with cleaning rollers such as a brush roller and a water absorbent roller, an air blow configuration in which clean air is blown onto the belt 233, or a combination of these. In the case of the configuration in which the belt 233 is nipped with the cleaning rollers, it is preferable to make the line velocity of the cleaning rollers different than that of the belt 233 to improve the cleaning effect.

The inkjet recording apparatus 200 can comprise a roller nip conveyance mechanism, in which the recording paper 216 is pinched and conveyed with nip rollers, instead of the suction belt conveyance unit 222. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 240 is disposed on the upstream side of the print unit 212 in the conveyance pathway formed by the suction belt conveyance unit 222. The heating fan 240 blows heated air onto the recording paper 216 to heat the recording paper 216 immediately before printing so that the ink deposited on the recording paper 216 dries more easily.

Figure 9:
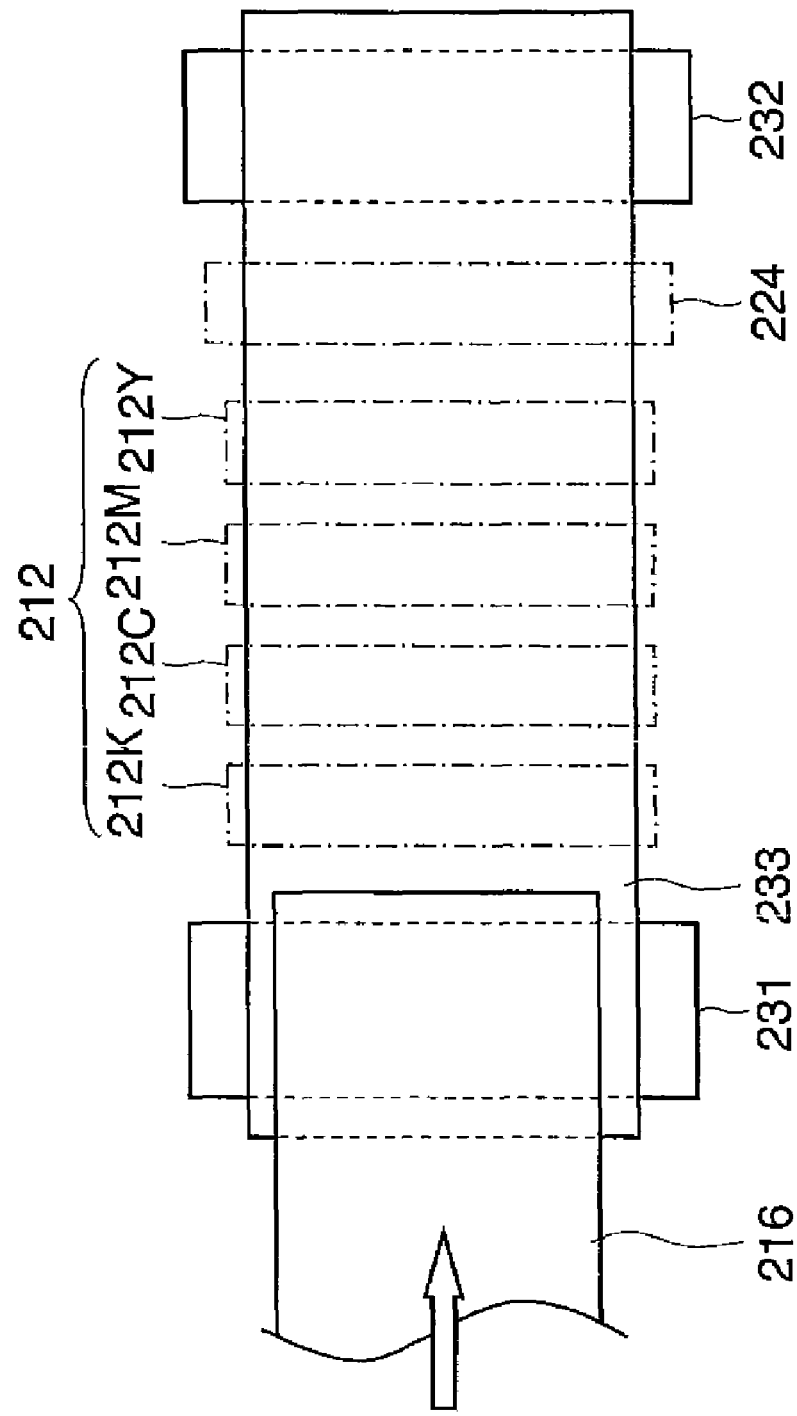
FIG. 9 is a principal plan diagram showing the peripheral area of a print unit of an inkjet recording apparatus.

The print unit 212 is a so-called "full line head" in which a line head having a length corresponding to the maximum paper width is arranged in a direction (main scanning direction) that is perpendicular to the paper conveyance direction (sub-scanning direction). The recording heads 212K, 212M and 212Y forming the print unit 212 are constituted by line heads in which a plurality of ink ejection ports (nozzles) are arranged through a length exceeding at least one edge of the maximum size recording paper 216 intended for use with the inkjet recording apparatus 200 (see FIG. 9).

The recording heads 212K, 212C, 212M and 212Y corresponding to respective ink colors are disposed in the order, black (K), cyan (C), magenta (M) and yellow (Y), from the upstream side (left-hand side in FIG. 8), following the direction of conveyance of the recording paper 216 (the paper conveyance direction). A color print can be formed on the recording paper 216 by ejecting the inks from the recording heads 212K, 212C, 212M and 212Y, respectively, onto the recording paper 216 while conveying the recording paper 216.

By adopting the print unit 212, in which the full line heads covering the full paper width are provided for the respective colors in this way, it is possible to record an image on the full surface of the recording paper 216 by performing just one operation of relatively moving the recording paper 216 and the print unit 212 in the paper conveyance direction (the sub-scanning direction), in other words, by means of a single sub-scanning action. Higher-speed printing is thereby made possible and productivity can be improved in comparison with a shuttle type head configuration in which a recording head reciprocates in the main scanning direction that is perpendicular to paper conveyance direction.

Although the configuration with the KCMY four standard colors is described in the present embodiment, combinations of the ink colors and the number of colors are not limited to those. Light inks or dark inks can be added as required. For example, a configuration is possible in which recording heads for ejecting light-colored inks such as light cyan and light magenta are added.

As shown in FIG. 8, the ink storing and loading unit 214 has tanks for storing the inks of K, C, M and Y to be supplied to the respective recording heads 212K, 212C, 212M and 212Y, and the tanks are connected to the respective recording heads 212K, 212C, 212M and 212Y by means of channels, which are omitted from figures. The ink storing and loading unit 214 has a warning device (for example, a display device or an alarm sound generator and the like) for warning when the remaining amount of any ink is low, and has a mechanism for preventing loading errors among the colors.

The print determination unit 224 has an image sensor (line sensor and the like) for capturing an image of the ink-droplet deposition result of the print unit 212, and functions as a device to check for ejection defects such as clogs of the nozzles in the print unit 212 from the ink-droplet deposition results evaluated by the image sensor.

The print determination unit 224 of the present embodiment is configured with at least a line sensor having rows of photoelectric transducing elements with a width that is greater than the ink-droplet ejection width (image recording width) of the respective recording heads 212K, 212C, 212M and 212Y. This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements which are arranged two-dimensionally.

The print determination unit 224 reads in the test pattern printed by the recording heads 212K, 212C, 212M and 212Y of the respective colors, and determines the ejection performed by the respective heads. The ejection determination includes the presence of the ejection, measurement of the dot size, and measurement of the dot deposition position.

A post-drying unit 242 is disposed following the print determination unit 224. The post-drying unit 242 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming into contact with ozone and other substance that cause dye molecules to break down, and has the effect of increasing the durability of the print.

A heating/pressurizing unit 244 is disposed following the post-drying unit 242. The heating/pressurizing unit 244 is a device to control the glossiness of the image surface, and the image surface is pressed with a pressure roller 245 having a predetermined uneven surface shape while the image surface is heated, and the uneven shape is transferred to the image surface.

The printed matter generated in this manner is outputted from the paper output unit 226. The target print (i.e., the result of printing the target image) and the test print are preferably outputted separately. In the inkjet recording apparatus 200, a sorting device (not shown) is provided for switching the outputting pathways in order to sort the printed matter with the target print and the printed matter with the test print, and to send them to paper output units 226A and 226B, respectively. When the target print and the test print are simultaneously formed in parallel on the same large sheet of paper, the test print portion is cut and separated by a cutter (second cutter) 248. The cutter 248 is disposed directly in front of the paper output unit 226, and is used for cutting the test print portion from the target print portion when a test print has been performed in the blank portion of the target print. The structure of the cutter 248 is the same as the first cutter 228 described above, and has a stationary blade 248A and a round blade 248B. Although not shown in Figures, the paper output unit 226A for the target prints is provided with a sorter for collecting prints according to print orders.

Figure 10:
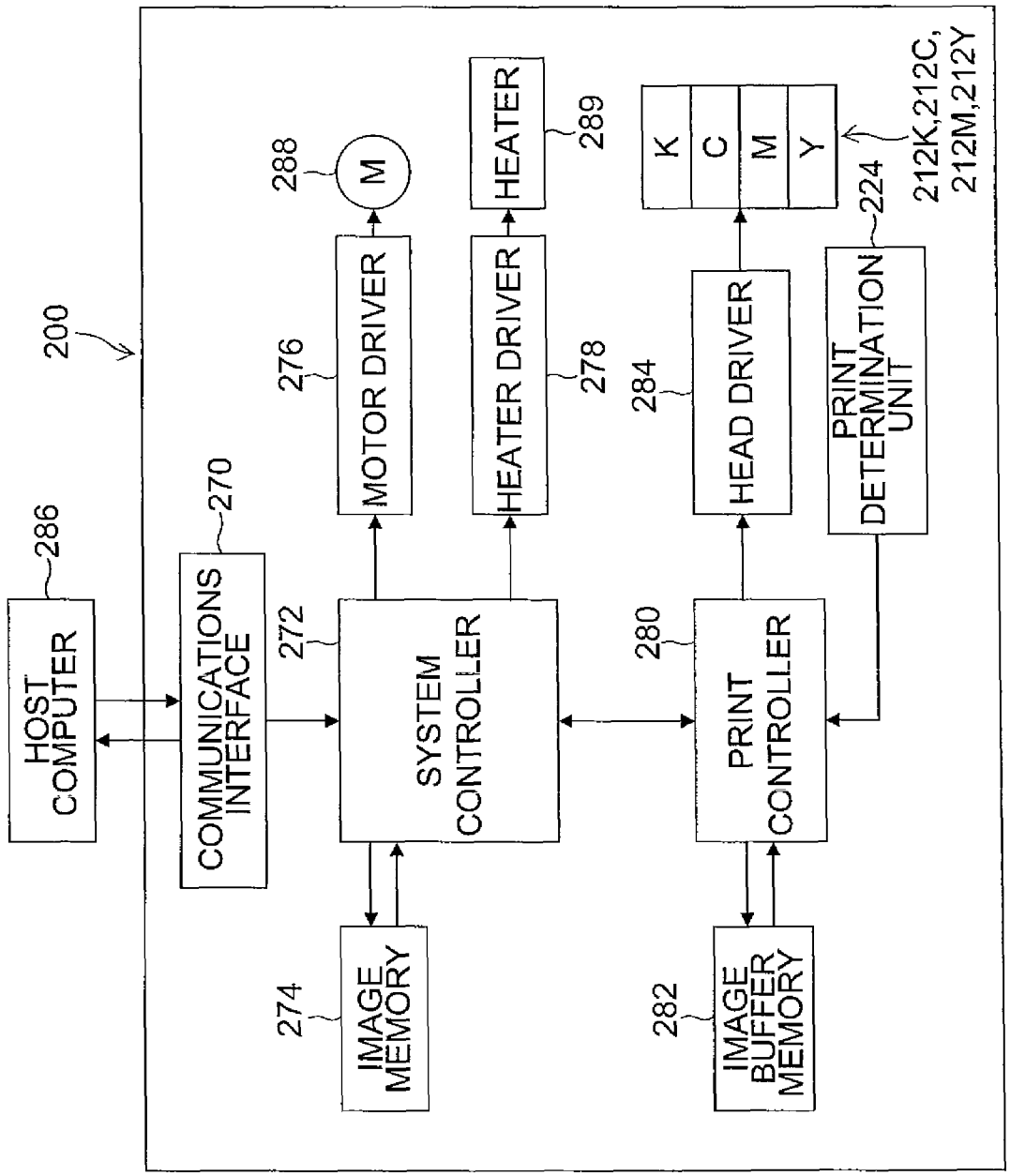
FIG. 10 is a principal block diagram showing the control system of an inkjet recording apparatus.

FIG. 10 is a principal block diagram showing the control system of the inkjet recording apparatus 200. The inkjet recording apparatus 200 comprises a communication interface 270, a system controller 272, an image memory 274, a motor driver 276, a heater driver 278, a print controller 280, an image buffer memory 282, a head driver 284, and the like.

The communication interface 270 is an interface unit for receiving image data sent from a host computer 286. A serial interface such as USB (Universal Serial Bus), IEEE1394, Ethernet (registered trademark), wireless network, or a parallel interface such as a Centronics interface may be used as the communication interface 270. A buffer memory (not shown) may be mounted in this portion in order to increase the communication speed. The image data sent from the host computer 286 is received by the inkjet recording apparatus 200 through the communication interface 270, and is temporarily stored in the image memory 274.

The image memory 274 is a storage device for temporarily storing images inputted through the communication interface 270, and data is written and read to and from the image memory 274 through the system controller 272. The image memory 274 is not limited to a memory composed of semiconductor elements, and a hard disk drive or another magnetic medium may be used.

The system controller 272 is a control unit which controls the respective sections, such as the communications interface 270, the image memory 274, the motor driver 276, the heater driver 278, and the like. The system controller 272 is made up of a central processing unit (CPU) and peripheral circuits thereof, and as well as controlling communications with the host computer 286 and controlling reading from and writing to the image memory 274, and the like, it generates control signals for controlling the motors 288 and heaters 289 in the conveyance system.

The motor driver (drive circuit) 276 drives the motor 288 in accordance with commands from the system controller 272. The heater driver (drive circuit) 278 drives the heater 289 of the post-drying unit 242 or the like in accordance with commands from the system controller 272.

The print controller 280 has a signal processing function for performing various tasks, compensations, and other types of processing for generating print control signals from the image data stored in the image memory 274 in accordance with commands from the system controller 272 so as to supply the generated print control signal (dot data) to the head driver 284. Prescribed signal processing is carried out in the print controller 280, and the ejection amount and the ejection timing of the ink from the respective recording heads 212K, 212C, 212M and 212Y are controlled via the head driver 284, on the basis of the print data. By this means, prescribed dot size and dot positions can be achieved.

The print controller 280 is provided with the image buffer memory 282; and image data, parameters, and other data are temporarily stored in the image buffer memory 282 when image data is processed in the print controller 280. The aspect shown in FIG. 10 is one in which the image buffer memory 282 accompanies the print controller 280; however, the image memory 274 may also serve as the image buffer memory 282. Also possible is an aspect in which the print controller 280 and the system controller 272 are integrated to form a single processor.

The head driver 284 generates drive signals for driving the piezoelectric actuators 16 (see FIG. 1) of the recording heads 212K, 212C, 212M, 212Y of the respective colors, on the basis of the dot data supplied from the print controller 280, and supplies the generated drive signals to the piezoelectric actuators 16. It is also possible to include a feedback control system in the head driver 284 in order to maintain uniform drive conditions of the recording heads 212K, 212C, 212M and 212Y.

The print determination unit 224 is a block that includes the line sensor as described above with reference to FIG. 8, reads the image printed on the recording paper 216, determines the print conditions (presence of the ejection, variation in the dot formation, and the like) by performing desired signal processing, or the like, and provides the determination results of the print conditions to the print controller 280.

According to requirements, the print controller 280 makes various corrections with respect to the recording heads 212K, 212C, 212M and 212Y on the basis of information obtained from the print determination unit 224.

A method of driving the piezoelectric actuator and a liquid ejection apparatus according to embodiments of the present invention have been described in detail above, but the present invention is not limited to the aforementioned embodiments, and it is of course possible for improvements or modifications of various kinds to be implemented, within a range which does not deviate from the essence of the present invention.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of driving a piezoelectric actuator which is constituted of a lower electrode film, a piezoelectric film and an upper electrode film that are layered successively onto a diaphragm, the piezoelectric film being oriented in an orientation direction from the lower electrode film toward the upper electrode film, the method comprising the steps of:

applying an electric field to the piezoelectric film in a direction opposite to the orientation direction of the piezoelectric film while continuously changing an intensity of the electric field from a first electric field intensity to a second electric field intensity, the first electric field intensity being smaller than a coercive electric field of the piezoelectric film, the second electric field intensity being larger than the coercive electric field of the piezoelectric film; and applying another electric field to the piezoelectric film in a direction that is parallel with the orientation direction of the piezoelectric film when the piezoelectric actuator is not being driven.

2. A liquid ejection apparatus, comprising:

a nozzle which ejects liquid;

a pressure chamber which is connected to the nozzle;

a diaphragm which constitutes one wall of the pressure chamber;

a piezoelectric actuator which is constituted of a lower electrode film, a piezoelectric film and an upper electrode film that are layered successively onto the diaphragm, the piezoelectric film being oriented in an orientation direction from the lower electrode film toward the upper electrode film;

a first electric field application device which applies an electric field to the piezoelectric film in a direction opposite to the orientation direction of the piezoelectric film while continuously changing an intensity of the electric field from a first electric field intensity to a second electric field intensity, the first electric field intensity being smaller than a coercive electric field of the piezoelectric film, the second electric field intensity being larger than the coercive electric field of the piezoelectric film; and a second electric field application device which applies another electric field to the piezoelectric film in a direction that is parallel with the orientation direction of the piezoelectric film when the liquid is not being ejected from the nozzle.

* * * * *